US008941015B2

(12) United States Patent
Hsu et al.

(10) Patent No.: US 8,941,015 B2
(45) Date of Patent: Jan. 27, 2015

(54) EMBEDDED CAPACITOR SUBSTRATE MODULE

(75) Inventors: Chien-Min Hsu, Hsinchu County (TW); Min-Lin Lee, Hsinchu (TW); Cheng-Liang Cheng, Hsinchu (TW); Li-Duan Tsai, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 539 days.

(21) Appl. No.: 13/197,283

(22) Filed: Aug. 3, 2011

(65) Prior Publication Data

US 2012/0168217 A1  Jul. 5, 2012

(30) Foreign Application Priority Data

Dec. 29, 2010  (TW) ............................... 99146695 A

(51) Int. Cl.
*H05K 1/16* (2006.01)
*H05K 1/02* (2006.01)
(Continued)

(52) U.S. Cl.
CPC ........ *H05K 1/0231* (2013.01); *H01L 23/49822* (2013.01); *H05K 1/162* (2013.01); *H01L 23/642* (2013.01); *H05K 3/4608* (2013.01); *H05K 2201/0187* (2013.01); *H05K 2201/09309* (2013.01); *H05K 2203/0315* (2013.01); *H01L 24/16* (2013.01); *H01L 2224/16227* (2013.01); *H01L 2224/16235* (2013.01); *H01L 2924/14* (2013.01); *H01L 2924/19041* (2013.01);
(Continued)

(58) Field of Classification Search
USPC .................. 174/260, 250, 255–259, 261, 262
See application file for complete search history.

(56) References Cited

U.S. PATENT DOCUMENTS 6,215,372 B1  4/2001  Novak
6,274,224 B1  8/2001  O'Bryan et al.
(Continued)

FOREIGN PATENT DOCUMENTS

CN    1465214 A    12/2003
TW    200703388    1/2007

OTHER PUBLICATIONS

Bjoern Martin et al., Electrode effects in solid electrolyte capacitors, Journal of Applied Physics, 2005, 074102-1-8, vol. 98.
(Continued)

*Primary Examiner* — Tremesha S Willis
(74) *Attorney, Agent, or Firm* — Tim Tingkang Xia, Esq.; Morris, Manning & Martin, LLP

(57) ABSTRACT

An embedded capacitor substrate module includes a substrate, a metal substrate and a solid electrolytic capacitor material. The solid electrolytic capacitor material is formed on the metal substrate, so as to form a solid electrolytic capacitor with the substrate. The embedded capacitor substrate module further includes an electrode lead-out region formed by extending the substrate and the metal substrate. The metal substrate serves as a first electrode, and the substrate serves as a second electrode. An insulating material is formed between the substrate and the metal substrate. Therefore, the embedded capacitor substrate module is not only advantageous in having a large capacitance as the conventional solid capacitor, but also capable of being drilled or plated and electrically connected to other circuits after being embedded in a printed circuit board.

23 Claims, 9 Drawing Sheets

(51) Int. Cl.
- *H01L 23/498* (2006.01)
- *H01L 23/64* (2006.01)
- *H05K 3/46* (2006.01)
- *H01L 23/00* (2006.01)
- *H01G 9/012* (2006.01)
- *H01G 9/15* (2006.01)

(52) U.S. Cl.
CPC ............... *H01G 9/012* (2013.01); *H01G 9/15* (2013.01); *H01L 2224/16225* (2013.01)
USPC ....................................................... 174/260

(56) References Cited

U.S. PATENT DOCUMENTS

| | | | |
|---|---|---|---|
| 6,466,430 B2 | 10/2002 | Mido et al. |
| 6,504,705 B2 | 1/2003 | Shimada et al. |
| 6,510,045 B2 | 1/2003 | Mido et al. |
| 6,775,125 B2 | 8/2004 | Kimura et al. |
| 6,775,126 B2 | 8/2004 | Fujii et al. |
| 6,822,849 B2 | 11/2004 | Miki et al. |
| 6,836,401 B2 | 12/2004 | Yoshida et al. |
| 6,852,137 B2 | 2/2005 | Miki et al. |
| 6,855,177 B2 | 2/2005 | Fujii et al. |
| 6,870,728 B1 | 3/2005 | Burket et al. |
| 6,882,544 B2 | 4/2005 | Nakamura et al. |
| 6,917,514 B2 | 7/2005 | Mido et al. |
| 6,980,416 B2 | 12/2005 | Sakaguchi et al. |
| 6,989,982 B2 | 1/2006 | Kobayashi et al. |
| 7,009,834 B2 | 3/2006 | Arai et al. |
| 7,042,709 B2 | 5/2006 | Kobayashi et al. |
| 7,054,141 B2 | 5/2006 | Sakaguchi et al. |
| 7,126,811 B2 | 10/2006 | Hirano et al. |
| 7,158,366 B2 | 1/2007 | Kobayashi et al. |
| 7,169,195 B2 | 1/2007 | Sakaguchi et al. |
| 7,227,739 B2 | 6/2007 | Kobayashi |
| 7,247,178 B2 | 7/2007 | Hirano et al. |
| 7,304,833 B1 | 12/2007 | Kobayashi |
| 7,317,610 B2 | 1/2008 | Nakamura et al. |
| 7,319,599 B2 | 1/2008 | Hirano et al. |
| 7,361,568 B2 | 4/2008 | Dunn et al. |
| 7,595,235 B2 | 9/2009 | Arai et al. |
| 2005/0152097 A1 | 7/2005 | Sakaguchi et al. |
| 2008/0216296 A1 | 9/2008 | Prymak et al. |
| 2011/0043967 A1* | 2/2011 | Kim et al. ..................... 361/523 |

OTHER PUBLICATIONS

Stura E et al., Hybrid organic-inorganic electrolytic capacitors, IEEE Trans Nanobioscience, 2002, Abstract only.

Yang Rao et al., Novel Ultra-high Dielectric Constant Polymer Based Composite Development for Embedded Capacitor Application, IEEE, Electronics Packaging Technology Conference, 2002, 65-69.

K. J. Lim et al., Dielectric Properties of Aluminium Solid Electrolytic Capacitor using Conduction Polymer, IEEE, Proceedings of the 4th International Conference on Properties and Applications of Dielectric Materials, 1994, 223-226.

Donald R. Cahela et al., Overview of Electrochemical Double Layer Capacitors, 1068-1073.

State Intellectual Property Office of the People's Republic of China, "Office Action", Jul. 1, 2013, China.

Intellectual Property Office, Ministry of Economic Affairs, R.O.C., "Notice of Allowance", Jun. 28, 2013, Taiwan.

\* cited by examiner

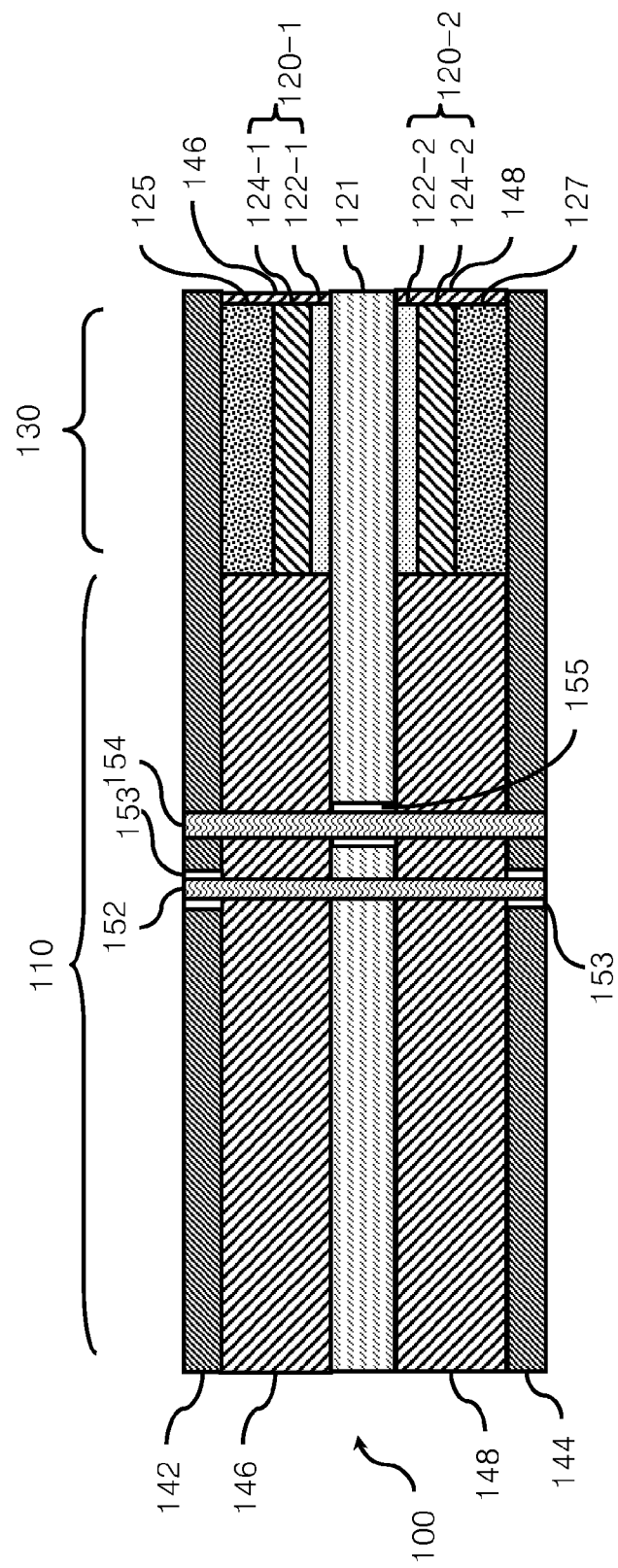

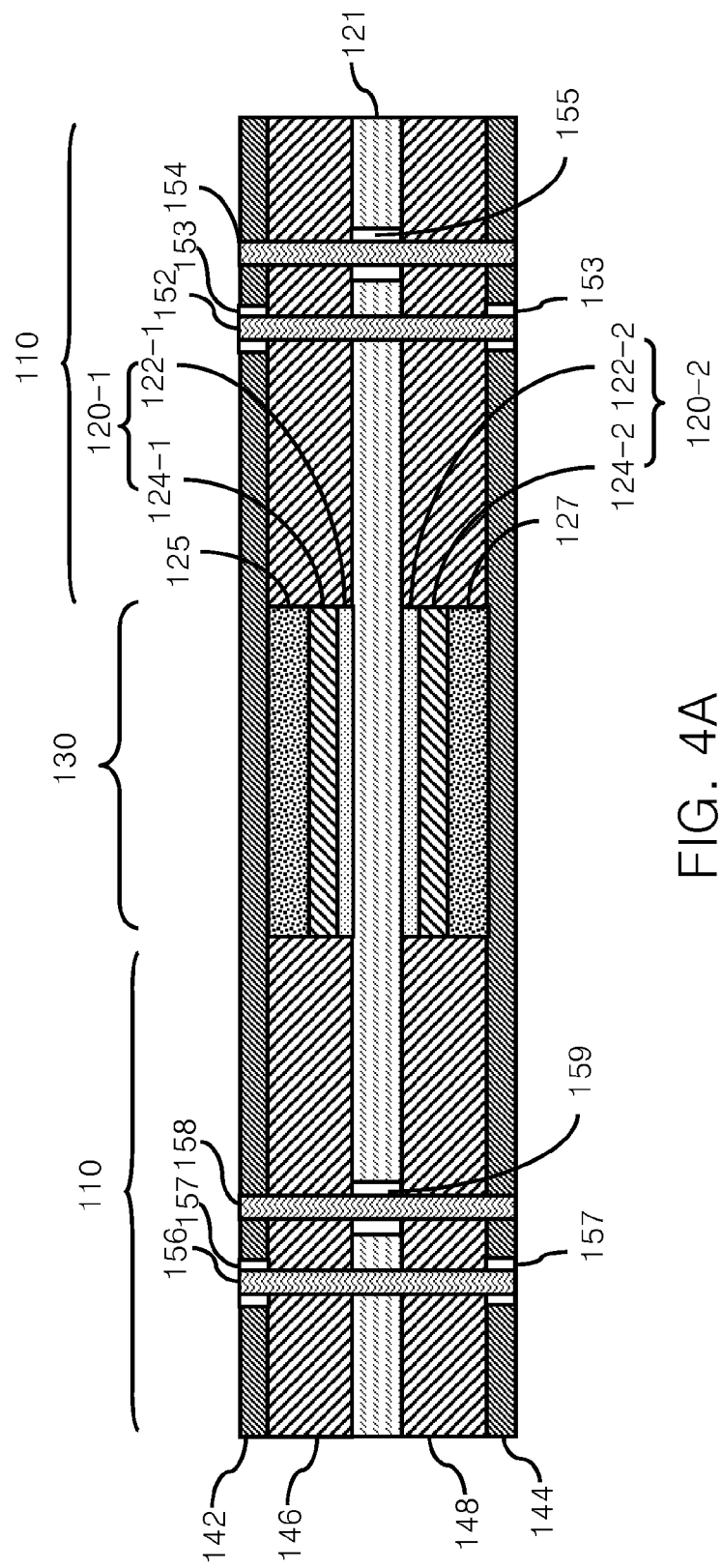

EMBEDDED CAPACITOR SUBSTRATE MODULE

CROSS-REFERENCE TO RELATED APPLICATIONS

This non-provisional application claims priority under 35 U.S.C. §119(a) on Patent Application No(s). 099146695 filed in Taiwan, R.O.C. on Dec. 29, 2010, the entire contents of which are hereby incorporated by reference.

BACKGROUND

1. Technical Field

The disclosure relates to an embedded capacitor substrate module, and more particularly to an embedded capacitor substrate module using a solid electrolytic capacitor structure to increase the capacitance.

2. Technical Art

With the continuous improvement of integrated circuit (IC) process technologies, the development of portable electronic products demands for light, thin, short, small, high speed, low power consumption and multifunction features. Due to the increase of the signal transmission speed, an IC carrier board is required to transmit signals with higher frequencies, and the interference generated by synchronous switching is aggravated accordingly. To reduce noises of a power delivery system on the IC carrier board, the current high-speed IC carrier board uses several surface mounted devices (SMD) capacitors to filter the noises. Such a capacitor is generally referred to as a decoupling capacitor or a bypass capacitor, mainly for storing rated electric power and supplying the electric power when needed, thereby achieving the effects of absorbing the glitch, reducing the radio frequency (RF) noises and stabilizing the power.

However, to provide an impedance path with a lower and wider frequency band, tens to hundreds of SMD capacitors need to be placed on the IC carrier board, and the capacitors are connected in parallel to achieve the purpose of reducing the low-frequency or high-frequency impedance. With the continuous rise of the IC signal transmission speed in the future and the limited area of the IC carrier board, an equivalent series inductance (ESL) that can be reduced by the SMD capacitors placed on the surface of the IC carrier board is inevitably suppressed.

Compared with the manner of welding the SMD capacitor on the surface of the printed circuit board or the IC carrier board, the manner of embedding the capacitor in the printed circuit board or the IC carrier board enables the capacitor to be closer to a power pin of an IC device, so that the ESL generated by a power delivery path of the capacitor embedded in the substrate at a high frequency is lower than that of the SMD capacitor. Compared with the decoupling capacitor device placed on the surface of the printed circuit board, the decoupling capacitor device embedded in the substrate is placed at a position closer to the IC, and the technology of embedding the capacitor in the substrate is one of the current methods for reducing the ESL generated by the power delivery path of the IC carrier board.

Although the technology of embedding the decoupling capacitor in the substrate is advantageous in having a low ESL, restricted by the specification of current leakage of the insulating material, the dielectric constant of the current organic insulating material is hard to exceed 100, and consequently the layers of the embedded planar capacitor must be increased upon the limited thickness and area of the substrate, so as to make the capacitance higher than 0.1 uF, which reduces the process yield and also increases the fabrication cost of the substrate. Furthermore, the capacitance provided by the technology of embedding the capacitor in the substrate cannot meet the demand for hundreds of uF capacitance of the IC carrier board currently. Therefore, it is a problem of the current technology of embedding the capacitor in the substrate in need of solution on how to increase the capacitance of the capacitor embedded in the substrate and increase the effective decoupling bandwidth.

SUMMARY

An embedded capacitor substrate module according to an embodiment of the disclosure comprises a substrate, a metal substrate and a solid electrolytic capacitor material. The solid electrolytic capacitor material is formed on the metal substrate such that the solid electrolytic capacitor material, a part of the metal substrate and a part of the substrate form a solid electrolytic capacitor. The module further comprises an electrode lead-out region formed by the remaining part of the metal substrate and the remaining part of the substrate. The metal substrate serves as a first electrode, and the substrate serves as a second electrode. The insulating material is formed on an area other than the area the solid electrolytic capacitor is formed between the substrate and the metal substrate.

An embedded capacitor substrate module according to an embodiment of the disclosure comprises an upper substrate, a lower substrate, a metal substrate and more than one layer of solid electrolytic capacitor material. The more than one layer of solid electrolytic capacitor material is formed between the upper substrate and the metal substrate and between the lower substrate and the metal substrate, to respectively form a solid electrolytic capacitor with the upper substrate and the lower substrate, or is optionally formed between the upper substrate and the metal substrate or between the lower substrate and the metal substrate, to respectively form a solid electrolytic capacitor with the upper substrate or the lower substrate. The module further comprises an electrode lead-out region formed by the remaining part of the upper substrate, the remaining part of the lower substrate, and the remaining part of the metal substrate. The metal substrate serves as a first electrode, and at least one of the upper substrate and the lower substrate serves as a second electrode. The insulating material is formed on an area other than the area the solid electrolytic capacitor is formed between the upper substrate and the metal substrate and is formed on an area other than the area the solid electrolytic capacitor is formed between the lower substrate and the metal substrate.

BRIEF DESCRIPTION OF THE DRAWINGS

The appended drawings contain figures of exemplary embodiments to further clarify the above of the invention. It will be appreciated that these drawings depict exemplary embodiments of the invention and are not intended to limits its scope. The invention will be described and explained with additional specificity and detail through the use of the accompanying drawings in which:

FIG. 2A and FIG. 2B are schematic structural views of the embedded capacitor substrate module according to another embodiment of the disclosure;

FIG. 4A and FIG. 4B are schematic structural views of the embedded capacitor substrate module according to another embodiment of the disclosure;

DETAILED DESCRIPTION OF THE DISCLOSURE

Figure 1:
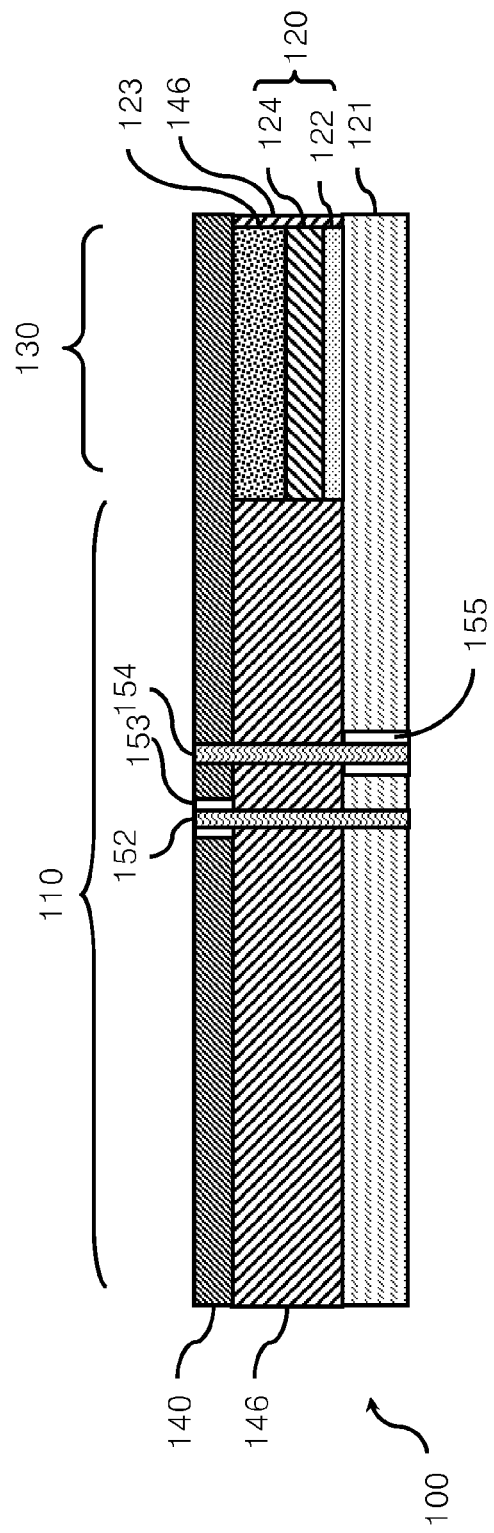
FIG. 1 is a schematic structural view of an embedded capacitor substrate module according to an embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

It should be illustrated that the thickness and size of every layer and the relative ratio between all the layers in the figures of the following embodiments are exemplary in the disclosure, and may be adjusted according to practical requirements by those of ordinary skill in the art. However, the disclosure may be implemented in different forms, but is not limited to the embodiments of the disclosure. In the drawings, to make it clear, the sizes and relative sizes of the layers and regions may be amplified and/or simplified. It should be noted that when a device or a layer is stated as being "on" another device or layer, "connected to" or "coupled to" another device or layer, the device or layer may be directly placed on another device or layer or an intermediate device or layer may exist. Furthermore, although several embodiments are mentioned hereinafter, in the drawings, the same devices are indicated by identical reference numerals. The use of the same reference number throughout the several figures designates a like or similar element, and thus detailed description is omitted.

In view of the problem that the current technology of embedding the capacitor in the substrate cannot greatly improve the capacitance, an embedded capacitor substrate module using a solid electrolytic capacitor is provided in the disclosure to solve the problem in the prior art.

FIG. 1 is a schematic structural view of an embedded capacitor substrate module according to an embodiment of the disclosure. As shown in FIG. 1, the embedded capacitor substrate module 100 comprises a solid electrolytic capacitor material 120, a metal substrate 121 and a substrate 140. The solid electrolytic capacitor material 120, a part of the metal substrate 121 and a part of the substrate 140 form a solid electrolytic capacitor 130. The remaining part of the metal substrate 121 and the remaining part of the substrate 140 is defined as an electrode lead-out region 110. The rest region is filled by an insulating material 146. The insulating material 146, which is formed on an area other than the area the solid electrolytic capacitor is formed may be, but not limited to, resin or a dielectric material. In one embodiment, the metal substrate 121 is formed to have scraggy surfaces by way of, but not limited to, etching process to increase the surface area of the metal substrate 121.

The solid electrolytic capacitor material 120 is formed on one side of the metal substrate 121. The solid electrolytic capacitor material 120 comprises, but not limited to, an aluminum oxide layer 122 and a conductive polymer layer 124.

It can be known from the figure that the conductive polymer layer 124 is formed on the aluminum oxide layer 122, and the material of the conductive polymer layer 124 may be, but not limited to, poly(3,4-ethylenedioxythiophene) (PEDOT). The metal substrate 121 generally is, but not limited to, an aluminum substrate.

One side of the solid electrolytic capacitor material 120 is in contact with the metal substrate 121, and the other side of the solid electrolytic capacitor material 120 is bonded with the substrate 140 through a conductive adhesive layer 123. That is, the substrate 140 is electrically connected to the conductive adhesive layer 123 and the conductive polymer layer 124. In an embodiment, the conductive adhesive layer 123 may be, but not limited to, carbon paste or an equivalent thereof. The material of the substrate 140 may be, but not limited to, copper or silver.

In the embodiment of FIG. 1, an electrode lead-out region 110 is formed outside the region where the solid electrolytic capacitor 130 is formed. The electrode lead-out region 110 is formed by extending the substrate 140 and the metal substrate 121 of the solid electrolytic capacitor 130. A solid electrolytic capacitor is formed in a region between a large-area metal substrate (the metal substrate 121 of the solid electrolytic capacitor 130) and the substrate 140, and the insulating material 146 is filled in the rest region between the metal substrate 121 and the substrate 140. The area in the horizontal direction of the metal substrate 121 of the embedded capacitor substrate module 100 is greater than the area in the horizontal direction of the solid electrolytic capacitor 130. Due to the large-area metal substrate and substrate structure, that is, the electrode lead-out region 110 formed by extending, a drilling or plating process can be directly performed on the substrate structure without destroying the electrolytic capacitor structure, so that the embedded solid electrolytic capacitor substrate module can be electrically connected to other outer or inner circuits.

For example, the embedded solid electrolytic capacitor substrate module is electrically connected to the external circuit by connecting to the metal substrate 121 through a first via 152 and connecting to the substrate 140 through a second via 154. In this case, the metal substrate 121 serves as a first electrode, and the substrate 140 serves as a second electrode. The positive and negative polarities of the first electrode and the second electrode are opposite to each other.

In this embodiment, the first via 152 and the second via 154 both penetrate the entire module, but since the first via 152 connects the metal substrate 121 and the second via 154 connects the substrate 140, the first via 152 is insulated from the substrate 140, and the second via 154 is insulated from the metal substrate 121. As shown in the figure, an insulating material 153 is formed around the first via 152 penetrating the substrate 140, and an insulating material 155 is formed around the second via 154 penetrating the metal substrate 121.

Figure 2B:
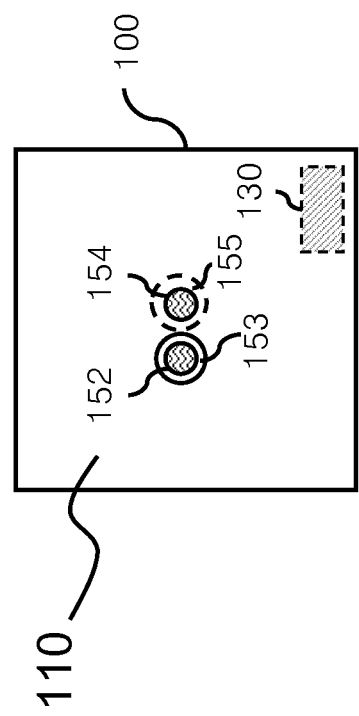

FIG. 2A and FIG. 2B are schematic structural views of the embedded capacitor substrate module according to another embodiment of the disclosure, in which FIG. 2A is a side view and FIG. 2B is a top view. As shown in FIG. 2A and FIG. 2B, the embedded capacitor substrate module 100 comprises two layers of solid electrolytic capacitor material 120-1, 120-2, a metal substrate 121, an upper substrate 142 and a lower substrate 144. One of the two layers of solid electrolytic capacitor material 120-1, a part of the metal substrate 121 and a part of the upper substrate 142 form a solid electrolytic capacitor 130. Likewise, the other one of the two layers of solid electrolytic capacitor material 120-2, a part of the metal substrate 121 and a part of the lower substrate 144 also form a solid electrolytic capacitor 130. The remaining part of the metal substrate 121 and the remaining part of the upper substrate 142 and the lower substrate 144 extend to form an electrode lead-out region 110. In this embodiment, the solid electrolytic capacitor material 120-1 is formed on the upper surface of the metal substrate 121 and the solid electrolytic capacitor material 120-2 is formed on the lower surface of the solid electrolytic capacitor material 120-2. That is, the solid electrolytic capacitor material is respectively formed between the upper substrate 142 and the metal substrate 121 and between the lower substrate 144 and the metal substrate 121. In another embodiment, a solid electrolytic capacitor may be optionally formed, that is, formed between the upper substrate 142 and the metal substrate 121 or formed between the lower substrate 144 and the metal substrate 121.

One side of the solid electrolytic capacitor material 120-1 not bonded with the metal substrate 121 is bonded with the upper substrate 142 through a first conductive adhesive layer 125, and one side of the solid electrolytic capacitor material 120-2 not bonded with the metal substrate 121 is bonded with the lower substrate 144 through a second conductive adhesive layer 127. That is, the upper substrate 142 is electrically connected to the conductive adhesive layer 125 and the conductive polymer layer 124-1. The substrate 144 is electrically connected to the conductive adhesive layer 127 and the conductive polymer layer 124-2. In an embodiment, the material of the first conductive adhesive layer 125 and/or the second conductive adhesive layer 127 may be, but not limited to, carbon paste or other conductive material. The material of the upper substrate 142 and the lower substrate 144 may be, but not limited to, copper or silver.

The solid electrolytic capacitor material 120-1 is formed being of, but not limited to, a two-layered structure. The solid electrolytic capacitor material 120-1 comprises, but are not limited to, aluminum oxide layers 122-1 and conductive polymer layers 124-1. Likewise, the solid electrolytic capacitor material 120-2 is formed being of, but not limited to, a two-layered structure. The solid electrolytic capacitor material 122-2 comprises, but are not limited to, aluminum oxide layers 122-2 and conductive polymer layers 124-2. The two aluminum oxide layers 122-1 and 122-2 are respectively formed on two surfaces of the metal substrate 121, and the two conductive polymer layers 124-1 and 124-2 are respectively formed on the two aluminum oxide layers 122-1 and 122-2. The insulating materials 146, 148 are respectively formed between the metal substrate 121 and the upper substrate 142 and between the metal substrate 121 and the lower substrate 144, and the insulating materials 146, 148 may be, but not limited to, resin or a dielectric material.

In the embodiment of FIG. 2A, an electrode lead-out region 110 is further formed outside the region where the solid electrolytic capacitor 130 is formed. The electrode lead-out region 110 is formed by extending the upper substrate 142, the lower substrate 144, the metal substrate 121, and the insulating materials 146, 148 respectively formed between the metal substrate 121 and the upper substrate 142 and between the metal substrate 121 and the lower substrate 144. The solid electrolytic capacitor 120-1 and 120-2 are respectively formed in a region between the large-area metal substrate 121 and the upper substrate 142 and between the large-area metal substrate 121 and the lower substrate 144, and the insulating materials 146, 148 are respectively formed, by laminated or other fabricated process, in the rest region between the metal substrate 121 and the upper substrate 140 and between the metal substrate 121 and the lower substrate 144. The areas in the horizontal direction of the metal substrate 121, the upper substrate 142 and the lower substrate 144 of embedded capacitor substrate module 100 are greater than the area in the horizontal direction of the solid electrolytic capacitor 130. Because the area of the metal substrate 121 is greater than that of the solid electrolytic capacitor 130, that is, the electrode lead-out region 110 formed by extending, a drilling or via plating process can be directly performed on the electrode lead-out region 110 without destroying the electrolytic capacitor structure, so that the embedded solid electrolytic capacitor substrate module can be electrically connected to other outer or inner circuits. In one embodiment, the metal substrate 121 is formed to have scraggy surfaces by way of, but not limited to, etching process to increase the surface area of the metal substrate 121.

For example, the embedded solid electrolytic capacitor substrate module is electrically connected to the external circuit by connecting to the metal substrate 121 through the first via 152 and connecting to the upper substrate 142 and the lower substrate 144 through the second via 154, the positions of which are shown in FIG. 1B. In this case, the metal substrate 121 serves as a first electrode, and at least one of the upper substrate 142 and the lower substrate 144 serves as a second electrode. The negative and positive polarities of the first electrode and the second electrode are opposite to each other. Although the second via 154 connects the upper substrate 142 and the lower substrate 144, but when one layer of solid electrolytic capacitor is formed, the second via 154 may also connect one of the upper substrate 142 and the lower substrate 144.

In this embodiment, the first via 152 and the second via 154 both penetrate the entire module, but since the first via 152 connects the metal substrate 121 and the second via 154 connects the upper substrate 142 and the lower substrate 144, the first via 152 is insulated from the upper substrate 142 and the lower substrate 144, and the second via 154 is insulated from the metal substrate 121. As shown in the figure, an insulating material 153 is formed around the first via 152 penetrating the upper substrate 142 and the lower substrate 144, and an insulating material 155 is formed around the second via 154 penetrating the metal substrate 121.

To improve the capacitance of the embedded planar capacitor of the IC carrier board, the embedded solid electrolytic capacitor substrate module described above and hereinafter may be integrated in the printed circuit board. Different from the solid capacitor in the prior art, the area of the metal substrate 121 and the substrate 140 (in the embodiment of FIG. 1) or the area (that is, the electrode lead-out region) of the metal substrate 121 and the upper substrate 142 and the lower substrate 144 (in the embodiment of FIG. 2A) of the solid electrolytic capacitor module of this structure is greater than that of the region (that is, the solid electrolytic capacitor 130, indicated by the slash region as shown in FIG. 2B) where the capacitance induced charges are actually generated. This structure has the feature that after the solid electrolytic capacitor substrate module is embedded in or laminated in the circuit board through a process of the printed circuit board, a drilling or plating process can be performed on the substrate area outside the slash region, so that the embedded solid electrolytic capacitor substrate module can be electrically connected to other outer or inner circuits to provide a large capacitor in the circuit through the plated-through-holes. In the prior art, the via is formed in or on the solid electrolytic capacitor to realize the connection of the capacitor and the external device.

It can be seen from FIG. 2A that, the solid electrolytic capacitor of the embedded capacitor substrate module 100 has two layers. Definitely, the solid electrolytic capacitor may also be designed as one layer according to practical requirements, and in this case, it still needs to be electrically connected to the upper substrate 142 or the lower substrate 144 through a conductive adhesive layer. When one of the layers is selected, at least one of the upper substrate 142 and the lower substrate 144 serves as the electrode.

Figure 3A:
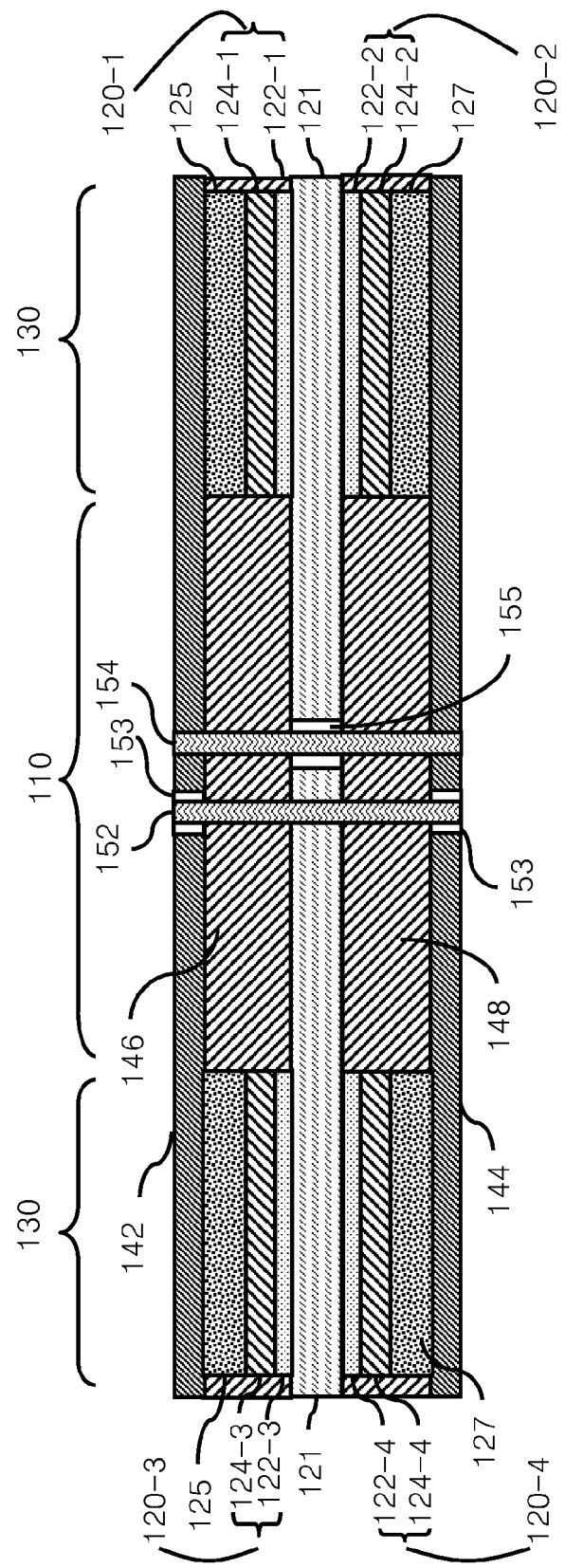
FIG. 3A and FIG. 3B are schematic structural views of the embedded capacitor substrate module according to another embodiment of the disclosure.
Figure 3B:
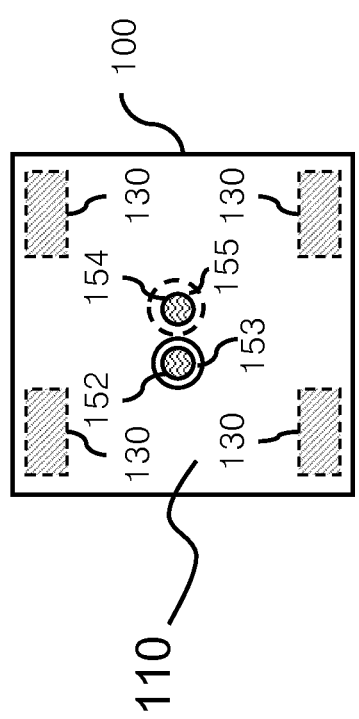
Figure 4B:
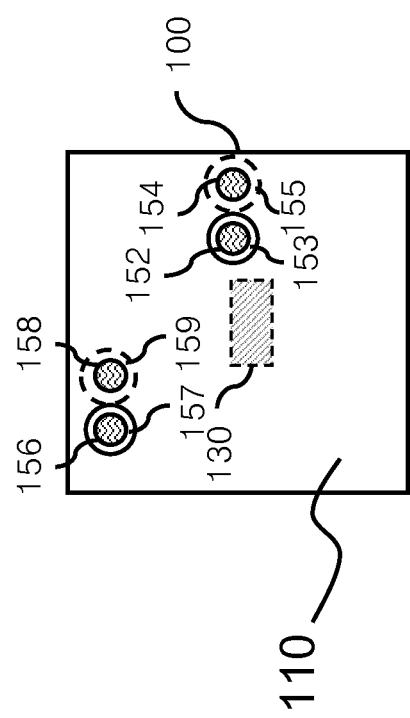

It can be seen from FIG. 2B that, the solid electrolytic capacitor 130 is disposed at one of the four corners of the embedded capacitor substrate module 100, and the first via 152 and the second via 154 are substantially disposed at the center, that is, the electrode lead-out region 110 of the embedded capacitor substrate module 100. The positions of the solid electrolytic capacitor and the first via 152 and the second via 154 are not fixed, and can be changed according to actual circuit design or system requirements. For example, in another embodiment of FIG. 3A and FIG. 3B, the solid electrolytic capacitor 130 is respectively disposed at all the four corners of the embedded capacitor substrate module 100, and the rest part is the electrode lead-out region 110. Besides the similar components illustrated in FIG. 2A and FIG. 2B, this embodiment further includes a solid electrolytic capacitor material 120-3 and a solid electrolytic capacitor material 120-4. The solid electrolytic capacitor material 120-3 includes an aluminum oxide layer 122-3 and a conductive polymer layer 124-3. The solid electrolytic capacitor material 120-4 includes an aluminum oxide layer 122-4 and a conductive polymer layer 124-4. The structures are similar to the aforementioned embodiment, and thus details are omitted. Also, in another embodiment of FIG. 4A and FIG. 4B, the solid electrolytic capacitor 130 is disposed at the center of the embedded capacitor substrate module 100, and the rest part is the electrode lead-out region 110. The first via 152 and the second via 154 are disposed on one side of the solid electrolytic capacitor 130, and it can be known from the figure that a third via 156 may be designed to connect the metal substrate 121 and a fourth via 158 may be designed to connect the upper substrate 142 and the lower substrate 144. The third via 156 may be electrically connected to the power, and the fourth via 158 may be electrically connected to the ground. As shown in FIG. 4A, an insulating material 157 is formed around the third via 156 penetrating the upper substrate 142 and the lower substrate 144, and an insulating material 159 is formed around the fourth via 158 penetrating the metal substrate 121.

Figure 5:
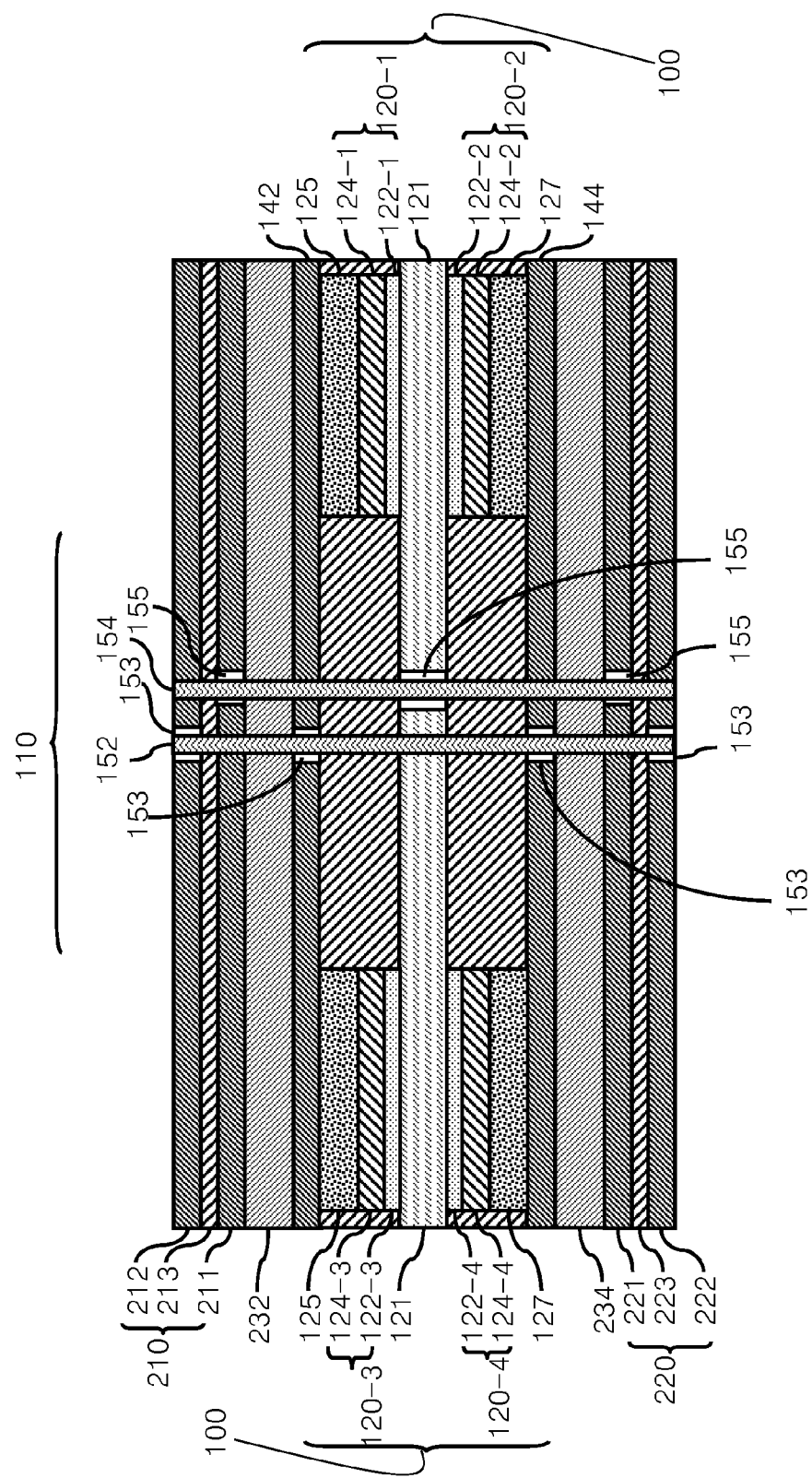
FIG. 5 is a schematic structural view of the embedded capacitor substrate module according to another embodiment of the disclosure.

FIG. 5 is a schematic structural view of the embedded capacitor substrate module according to another embodiment of the disclosure. As shown in FIG. 5, the embedded capacitor substrate module 100 is connected in parallel to a planar capacitor 210 and/or a planar capacitor 220. The planar capacitor 210 is formed on one surface of the embedded capacitor substrate module 100, and the planar capacitor 220 is formed on the other surface of the embedded capacitor substrate module 100. The planar capacitor 210 is bonded with the embedded capacitor substrate module 100 through a bonding layer 232. The planar capacitor 220 is also bonded with the embedded capacitor substrate module 100 through a bonding layer 234. The bonding layers are made of an insulating material. The planar capacitor 210 comprises a first metal layer 211, a second metal layer 212 and an insulating layer 213 formed between the first metal layer 211 and the second metal layer 212. The planar capacitor 220 comprises a first metal layer 221, a second metal layer 222 and an insulating layer 223 formed between the first metal layer 221 and the second metal layer 222. The first via 152 and the second via 154 are formed in the electrode lead-out region 110. The first via 152 connects the metal substrate 121 of the solid electrolytic capacitor, the first metal layer 211 of the planar capacitor 210 and the first metal layer 221 of the planar capacitor 220. The second via 154 connects the upper substrate 142 and the lower substrate 144 of the embedded capacitor substrate module 100, the second metal layer 212 of the planar capacitor 210, and the second metal layer 222 of the planar capacitor 220. By the design of the first via 152 and the second via 154 and the connection relations thereof, the embedded capacitor substrate module 100 and the planar capacitors 210, 220 are electrically connected in parallel.

In this embodiment, since the polarities of the first via and the second via are opposite, and the first via 152 connects the metal substrate 121 of the solid electrolytic capacitor, the first metal layer 211 of the planar capacitor 210 and the first metal layer 221 of the planar capacitor 220, the second via 154 is electrically insulated from the metal substrate 121, the first metal layer 211 and the first metal layer 221. Likewise, the second via 154 connects the upper substrate 142 and the lower substrate 144 of the embedded capacitor substrate module 100, the second metal layer 212 of the planar capacitor 210 and the second metal layer 222 of the planar capacitor 220; and the first via 152 is electrically insulated from the metal layers 142, 144, 212 and 222. As shown in the figure, an insulating material 153 is formed around the first via 152 penetrating the upper substrate 142 and the lower substrate 144 of the embedded capacitor substrate module 100, the second metal layer 212 of the planar capacitor 210 and the second metal layer 222 of the planar capacitor 220, and also an insulating material 155 is formed around the second via 154 penetrating the metal substrate 121 of the solid electrolytic capacitor, the first metal layer 211 of the planar capacitor 210 and the first metal layer 221 of the planar capacitor 220. In one embodiment, the metal substrate 121 is formed to have scraggy surfaces by way of, but not limited to, etching process to increase the surface area of the metal substrate 121.

It can be seen from FIG. 5 that, in addition to the solid electrolytic capacitor of the embedded capacitor substrate module 100, two sets of the planar capacitors are provided, so that the solid electrolytic capacitor substrate module may provide several nF to hundreds of uF capacitance at the same time. The capacitor module in the embodiment of FIG. 5 may suppress both the high-frequency and low-frequency noises. Definitely, the number of the solid electrolytic capacitor, the number of the planar capacitor and the positions of the first via and the second via in the embedded capacitor substrate module 100 are not fixed, and can be changed according to actual circuit design or system requirements. That is, the planar capacitor may be designed as one layer, and in this case, the position of the insulating layer around the first via 152 and the second via 154 is adjusted accordingly.

In other embodiments, the insulating material of the planar capacitor may be fabricated or ink-jet printed with a high dielectric constant.

Figure 6:
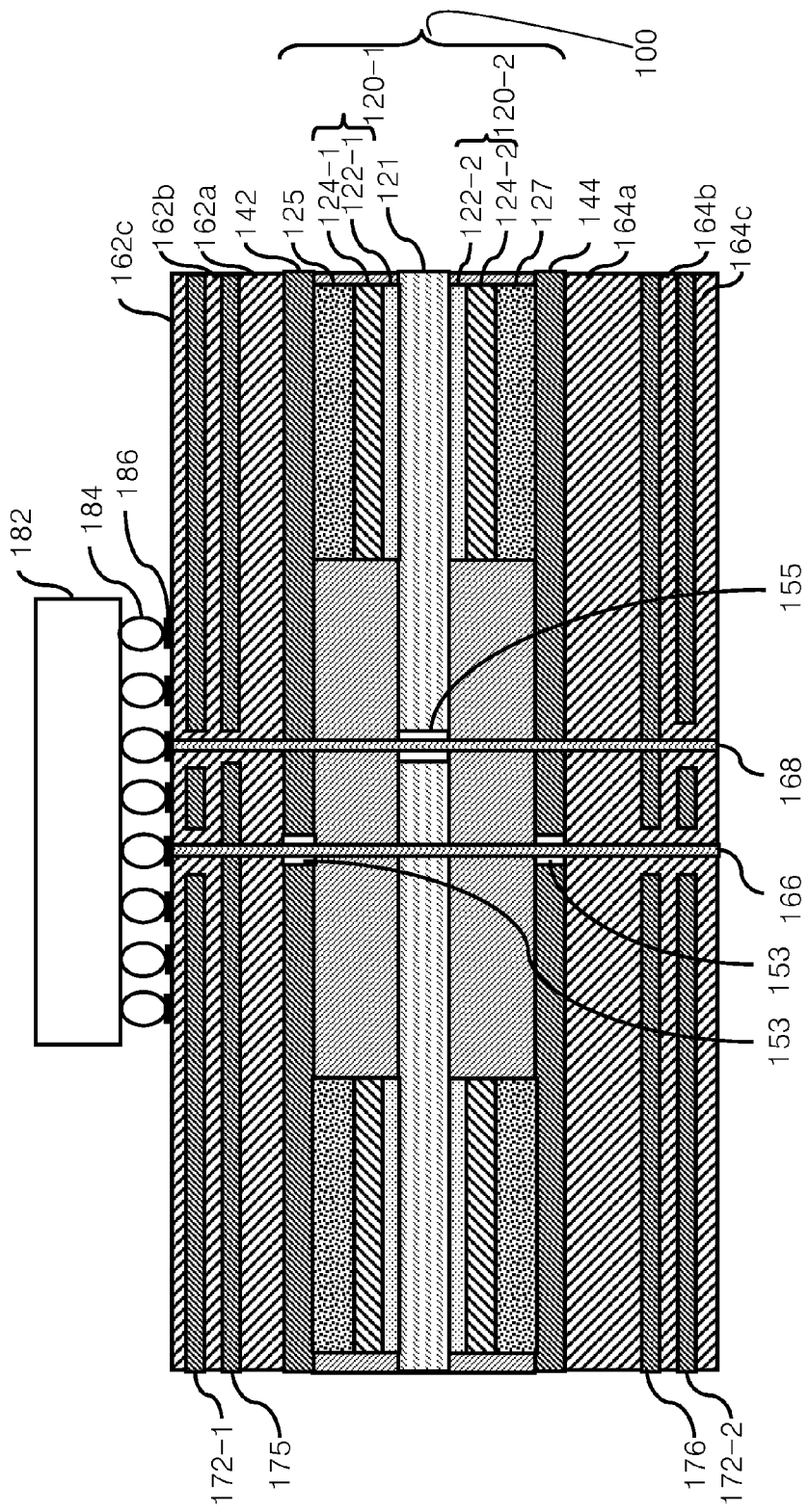
FIG. 6 is a schematic structural view of the embedded capacitor substrate module according to another embodiment of the disclosure.

FIG. 6 illustrates an application of the embedded capacitor substrate module in FIG. 5. As shown in FIG. 6, an embedded capacitor substrate module 100 is formed in an IC carrier board, insulating layers 162a, 162b, 162c, 164a, 164b and 164c are respectively formed on upper and lower surfaces of the embedded capacitor substrate module 100, and the embedded capacitor substrate module is built in the IC carrier board. The IC carrier board also has signal layers 172-1, 172-2, a power layer 175 and a grounding layer 176, which are respectively formed in the insulating layers 162a, 162b, 162c, 164a, 164b and 164c. During manufacture process, the insulating layer 162a is formed on the upper surface of the module 100. Then the power layer 175, the insulating layer 162b, the signal layer 172-1, and the insulating layer 162c are sequentially formed. Similarly, the insulating layer 164a is formed on the lower surface of the module 100. Then the grounding layer 176, the insulating layer 164b, the signal layer 172-2, and the insulating layer 164c are sequentially formed. Although the layers are collectively named as the insulating layers 162a, 162b, 162c, 164a, 164b and 164c, those skilled in the art should understand that the insulating layers 162a, 162b, 162c, 164a, 164b and 164c, the signal layer 172, the power layer 175 and the grounding layer 176 are formed layer by layer. An IC 182 is electrically connected to the IC carrier board by solder balls 184 and pads 186, that is, at least one of the solder balls of the IC 182 is electrically connected to the grounding layer 176 of the IC carrier board, and at least another solder ball is electrically connected to the power layer 175 of the IC carrier board. The signal layers 172-1, 172-2 of the IC carrier board are used for transmitting signals. Likewise, the first via 166 connects the metal substrate 121 of the solid electrolytic capacitor and the power layer 175 of the IC carrier board, and the second via 168 connects the upper substrate 142 and the lower substrate 144 of the embedded capacitor substrate module 100 and the grounding layer 176 of the IC carrier board. This architecture provides the capacitance required by the IC on the surface of the IC carrier board.

Similar to the above embodiments, an insulating material 153 is formed around the first via 166 penetrating the upper substrate 142 and the lower substrate 144, and an insulating material 155 is formed around the second via 168 penetrating the metal substrate 121.

The disclosure provides the large-area and high-capacitance embedded capacitor substrate module, which may be embedded in the printed circuit board and may also be connected in parallel to the embedded planar capacitor of the organic substrate. This capacitor module may provide several nF to hundreds of uF capacitance to solve the problem that the capacitance of the current embedded planar capacitor of the printed circuit board cannot exceed uF. The substrate embedded capacitor module may be applied in the printed circuit board and the chip carrier board, and provide a decoupling capacitor or a bypass capacitor having a large capacitance, wide frequency band and low impedance, thereby achieving the purpose of stabilizing the power system of the IC.

The embedded capacitor substrate module according to the embodiment of the disclosure is not only advantageous in having a large capacitance as the conventional solid capacitor, but also capable of being drilled or plated and electrically connected to other circuits after being embedded in a printed circuit board.

According to the embodiment of the disclosure, the circuit having the capacitance above 100 uF may be provided in the printed circuit board. Moreover, an ultra-thin planar capacitor made of an organic dielectric material may be connected in parallel in the embodiment of the disclosure, and further, the circuit having the capacitance of tens of nF to hundreds of uF may be provided in the printed circuit board, thereby providing the effect of suppressing both the low-frequency-band and high-frequency-band power noises.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. An embedded capacitor substrate module, comprising:
   a substrate, having a first part and a second part;
   a metal substrate, having a first part and a second part, wherein the first part of the metal substrate corresponds to the first part of the substrate, and the second part of the metal substrate corresponds to the second part of the substrate;
   a solid electrolytic capacitor material, disposed on the metal substrate and disposed between the first part of the substrate and the first part of the metal substrate, and the solid electrolytic capacitor material comprises an aluminum oxide layer and a conductive polymer layer;
   an electrode lead-out region, disposed by the second part of the metal substrate, a first insulating material, and the second part of the substrate, wherein the metal substrate serves as a first electrode, and the substrate serves as a second electrode;
   a first via, disposed in the electrode lead-out region, to electrically connect the metal substrate and to be electrically isolated from the substrate; and
   a second via, disposed in the electrode lead-out region, to electrically connect the substrate and to be electrically isolated from the metal substrate;
   wherein the first insulating material is disposed between the second part of the substrate and the second part of the metal substrate.

2. The embedded capacitor substrate module according to claim 1, wherein a second insulating material is disposed around the first via penetrating the substrate, and a third insulating material is disposed around the second via penetrating the metal substrate.

3. The embedded capacitor substrate module according to claim 1, wherein one side of the solid electrolytic capacitor material not in contact with the metal substrate is bonded with the substrate through a conductive adhesive layer.

4. The embedded capacitor substrate module according to claim 3, wherein the conductive adhesive layer is carbon paste.

5. The embedded capacitor substrate module according to claim 1, wherein the metal substrate is an aluminum substrate.

6. The embedded capacitor substrate module according to claim 1, wherein the metal substrate is disposed to have a scraggy surface.

7. The embedded capacitor substrate module according to claim 1, wherein a material of the substrate is copper or silver.

8. The embedded capacitor substrate module according to claim 1, wherein the first insulating material is resin or a dielectric material.

9. An embedded capacitor substrate module, comprising:
   an upper substrate, having a first part and a second part;
   a lower substrate, having a first part and a second part, wherein the first part of the lower substrate corresponds to the first part of the upper substrate, and the second part of the lower substrate corresponds to the second part of the upper substrate;
   a metal substrate, having a first part and a second part, wherein the first part of the metal substrate corresponds to the first part of the lower substrate, and the second part of the metal substrate corresponds to the second part of the lower substrate;
   more than one layer of solid electrolytic capacitor material, disposed between the first part of the upper substrate and the first part of the metal substrate and between the first part of the lower substrate and the first part of the metal substrate, or optionally disposed between the first part of the upper substrate and the first part of the metal substrate or between the first part of the lower substrate and the first part of the metal substrate, wherein the solid electrolytic capacitor material comprises an aluminum oxide layer and a conductive polymer layer;

an electrode lead-out region, disposed by a plurality of first insulating materials, the second part of the upper substrate, the second part of the lower substrate, and the second part of the metal substrate, wherein the metal substrate serves as a first electrode, and at least one of the upper substrate and the lower substrate serves as a second electrode;

a first via, disposed in the electrode lead-out region, to electrically connect the metal substrate and to be electrically isolated from at least one of the upper substrate and the lower substrate; and a second via, disposed in the electrode lead-out region, to electrically connect at least one of the upper substrate and the lower substrate and to be electrically isolated from the metal substrate;

wherein the plurality of first insulating materials is disposed between the second part of the upper substrate and the second part of the metal substrate and disposed between the second part of the lower substrate and the second part of the metal substrate.

10. The embedded capacitor substrate module according to claim 9, wherein a second insulating material is disposed around the first via penetrating the upper substrate and the lower substrate, and a third insulating material is disposed around the second via penetrating the metal substrate.

11. The embedded capacitor substrate module according to claim 9, wherein when the more than one layer of solid electrolytic capacitor material is disposed between the upper substrate and the metal substrate and between the lower substrate and the metal substrate, one of the more than one layer of solid electrolytic capacitor material is bonded with the upper substrate through a first conductive adhesive layer, and the other one of the more than one layer of solid electrolytic capacitor material is bonded with the lower substrate through a second conductive adhesive layer.

12. The embedded capacitor substrate module according to claim 11, wherein the first conductive adhesive layer is carbon paste, and the second conductive adhesive layer is carbon paste.

13. The embedded capacitor substrate module according to claim 9, wherein the metal substrate is an aluminum substrate.

14. The embedded capacitor substrate module according to claim 9, wherein the metal substrate is disposed to have a scraggy surface.

15. The embedded capacitor substrate module according to claim 9, wherein a material of the upper substrate and the lower substrate is copper or silver.

16. The embedded capacitor substrate module according to claim 9, wherein the plurality of first insulating materials is resin or a dielectric material.

17. The embedded capacitor substrate module according to claim 10, further comprising a capacitor, wherein the solid electrolytic capacitor material is disposed on a first surface of the upper substrate and a second surface of the lower substrate, and the capacitor is disposed above a surface opposite to the first surface of the upper substrate and/or below a surface opposite to the second surface of the lower substrate.

18. The embedded capacitor substrate module according to claim 17, further comprising a bonding layer disposed between the capacitor and the upper substrate and/or between the capacitor and the lower substrate.

19. The embedded capacitor substrate module according to claim 17, wherein the capacitor comprises a first metal layer, a second metal layer and a fourth insulating material disposed between the first metal layer and the second metal layer.

20. The embedded capacitor substrate module according to claim 9, wherein the solid electrolytic capacitor material is disposed at a center of the embedded capacitor substrate module.

21. The embedded capacitor substrate module according to claim 9, wherein a number of layers of the solid electrolytic capacitor material is multiple.

22. The embedded capacitor substrate module according to claim 9, further comprising insulating materials respectively disposed on an upper surface and a lower surface of the embedded capacitor substrate module, being embedded in an integrated circuit carrier having signal layers, a power layer and a grounding layer respectively disposed in the insulating materials.

23. The embedded capacitor substrate module according to claim 22, wherein the embedded capacitor substrate module electrically connects to the integrated circuit carrier by solder balls and pads.

* * * * *